(12) United States Patent
Greco et al.

(10) Patent No.: US 10,169,525 B2
(45) Date of Patent: Jan. 1, 2019

(54) MULTIPLE-DEPTH TRENCH INTERCONNECT TECHNOLOGY AT ADVANCED SEMICONDUCTOR NODES

(71) Applicant: International Business Machines Corporation, Armonk, NY (US)

(72) Inventors: Stephen E. Greco, Lagrangeville, NY (US); Vincent J. McGahay, Poughkeepsie, NY (US); Rasit O. Topaloglu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/619,004

(22) Filed: Jun. 9, 2017

(65) Prior Publication Data
US 2017/0277823 A1    Sep. 28, 2017

Related U.S. Application Data

(60) Division of application No. 14/883,243, filed on Oct. 14, 2015, now Pat. No. 9,710,592, which is a (Continued)

(51) Int. Cl.
*G06F 17/00* (2006.01)
*G06F 17/50* (2006.01)
(Continued)

(52) U.S. Cl.
CPC ........ *G06F 17/5081* (2013.01); *G03F 7/2022* (2013.01); *G06F 17/5077* (2013.01); *H01L 21/31144* (2013.01); *H01L 21/67063* (2013.01); *H01L 21/76802* (2013.01); *H01L 21/76816* (2013.01)

(58) Field of Classification Search
USPC ........................................................ 438/702
See application file for complete search history.

(56) References Cited

U.S. PATENT DOCUMENTS 6,664,011 B2   12/2003   Lin et al.
6,883,158 B1    4/2005   Sandstrom et al.
(Continued)

OTHER PUBLICATIONS

List of IBM Patents or Patent Applications Treated as Related.

*Primary Examiner* — Mohammed Alam
(74) *Attorney, Agent, or Firm* — Scully, Scott, Murphy & Presser, P.C.; Steven J. Meyers, Esq.

(57) ABSTRACT

A metal interconnect structure, a system and method of manufacture, wherein a design layout includes results in forming at least two trenches of different trench depths. The method uses a slightly modified BEOL processing stack to prevent metal interconnect structures from encroaching upon an underlying hard mask dielectric or metallic hard mask layer. Thus two trench depths are obtained by tuning parameters of the system and allowing areas exposed by two masks to have deeper trenches. Here, the BEOL Stack processing is modified to enable two trench depths by using a hardmask that defines the lowest etch depth. The design may be optimized by software which optimizes a design for electromigration (or setup timing violations) by utilizing secondary trench depths, checking space opportunity around wires, pushing wires out to generate space and converting a wire to deep trench wire.

6 Claims, 7 Drawing Sheets

Related U.S. Application Data continuation of application No. 14/285,719, filed on May 23, 2014, now Pat. No. 9,454,631.

(51) Int. Cl.
*H01L 21/768* (2006.01)
*H01L 21/67* (2006.01)
*G03F 7/20* (2006.01)
*H01L 21/311* (2006.01)

(56) References Cited

U.S. PATENT DOCUMENTS

| | | |
|---|---|---|
| 7,224,030 B2 | 5/2007 | Schroeder |
| 7,410,736 B2 | 8/2008 | Bleeker et al. |
| 7,444,616 B2 | 10/2008 | Sandstrom et al. |
| 7,927,928 B2 | 4/2011 | Pierrat |
| 8,575,664 B2 | 11/2013 | Rothberg et al. |
| 8,598,632 B2 | 12/2013 | Tran et al. |
| 8,601,407 B2 | 12/2013 | Wang et al. |
| 8,605,249 B2 | 12/2013 | Inoue et al. |
| 8,610,093 B2 | 12/2013 | Kruit |
| 8,610,986 B2 | 12/2013 | Jain et al. |
| 8,627,244 B2 | 1/2014 | Agarwal et al. |
| 8,629,064 B2 | 1/2014 | Li et al. |
| 8,629,389 B2 | 1/2014 | Barrows |
| 8,630,322 B2 | 1/2014 | Dantus et al. |
| 8,631,373 B1 | 1/2014 | Gennari et al. |
| 8,631,379 B2 | 1/2014 | Chen et al. |
| 8,631,381 B2 | 1/2014 | Dai et al. |
| 2002/0031896 A1 | 3/2002 | Sakamoto |
| 2004/0268289 A1 | 12/2004 | Sandstrom et al. |
| 2005/0085085 A1 | 4/2005 | Borodovsky |
| 2005/0106837 A1 | 5/2005 | Nakai et al. |
| 2005/0151256 A1 | 7/2005 | Natzle |
| 2006/0046422 A1 | 3/2006 | Tran et al. |
| 2009/0104549 A1 | 4/2009 | Sandstrom et al. |
| 2013/0174106 A1 | 7/2013 | Hsu et al. |
| 2013/0198696 A1 | 8/2013 | Wang et al. |
| 2013/0280813 A1 | 10/2013 | Rothberg et al. |
| 2013/0292743 A1 | 11/2013 | Rothberg et al. |
| 2013/0324421 A1 | 12/2013 | Rothberg et al. |
| 2013/0338046 A1 | 12/2013 | Rothberg et al. |
| 2014/0005555 A1 | 1/2014 | Tesar |
| 2014/0011204 A1 | 1/2014 | Unger et al. |
| 2014/0013361 A1 | 1/2014 | Monari et al. |
| 2014/0145342 A1 | 5/2014 | Schultz et al. |
| 2014/0203447 A1* | 7/2014 | Bao ............... H01L 21/7681 257/774 |
| 2014/0284813 A1* | 9/2014 | Greco ............ H01L 21/76811 257/774 |
| 2015/0102461 A1 | 4/2015 | Lee |
| 2015/0227666 A1 | 8/2015 | Seo et al. |
| 2015/0332996 A1 | 11/2015 | Kuo et al. |
| 2015/0339422 A1* | 11/2015 | Greco ............... G06F 17/5068 438/702 |
| 2016/0042114 A1* | 2/2016 | Greco ............... G06F 17/5081 438/702 |
| 2016/0043088 A1* | 2/2016 | Cartier ............ H01L 27/1087 257/303 |
| 2017/0277823 A1* | 9/2017 | Greco ............... G06F 17/5077 |

\* cited by examiner

MULTIPLE-DEPTH TRENCH INTERCONNECT TECHNOLOGY AT ADVANCED SEMICONDUCTOR NODES

CROSS-REFERENCE TO RELATED APPLICATIONS

The present disclosure is a divisional application of commonly-owned, co-pending U.S. patent application Ser. No. 14/883,243 filed Oct. 14, 2015 which is continuation-in-part application of commonly-owned U.S. Pat. No. 9,454,631, the entire contents and disclosure of which is wholly incorporated by reference as if fully set forth herein.

BACKGROUND

The present disclosure relates generally to improvements in BEOL (Back End of Line) process technologies where double patterning is necessary, and includes structure and programmable methods for generating an interconnect technology having co-existing standard depth and deep trenches in the design layout.

Printing a lithographic pattern having pitches below lithographic limits of traditional lithographic techniques results in degradation of the fidelity of the printed pattern. To overcome this problem, a multi-exposure technique in which multiple lithographic exposures are performed for a single level, can be employed. In order to implement the multi-exposure technique, a given design shape in a design level may be decomposed into multiple decomposed design shapes. The multiple decomposed design shapes are assigned to different lithographic masks that correspond to different "colors" that collectively constitute the design level. The process of decomposing design shapes into groups of decomposed design shapes corresponding to different colors is referred to as "coloring."

A design shape in a design level can thus include multiple decomposed shapes corresponding to different colors. The number of colors corresponds to the number of lithographic masks to be employed to print the lithographic pattern corresponding to the design shapes in the design level. Each lithographic mask includes decomposed design shapes of the same color. Each lithographic exposure adds the pattern corresponding to decomposed design shapes of a corresponding color to a hard mask layer. If performed correctly, the multiple lithographic exposures add the patterns of the decomposed design shapes of all the colors of the design level to generate the pattern of the original design shape in the design level.

To ensure that the multiple lithographic exposures result in replication of the original pattern despite overlay variations and variations in other lithographic parameters, generation of areas of overlap are built into the decomposition process. The process of generation of areas of overlap between design shapes having different colors and derived from decomposition of an original design shape in the given design level is referred to as "stitching." An area of overlap between design shapes having different colors is referred to as a "stitch," a "stitch region," or a "stitching area."

Lithographic pattern transfer is implemented by transferring a pattern in a photoresist layer into a material layer by an exposure process. Lithographic pattern transfer is usually followed by an etch process. Stitches correspond to regions in which multiple exposure and etch processes are performed in a same material layer. If a region corresponding to a stitch is etched through unintentionally, a via structure is collaterally formed during a via etch process when a via structure should not be formed. Formation of such a collateral via structure can create electrical shorts in a metal interconnect structure among components that should be electrically isolated. Further, such a collateral via can be narrow and prevent deposition of a diffusion barrier layer at a thickness sufficient to prevent diffusion of metals (e.g., copper). In that case, metal can diffuse through thin portions of the diffusion barrier layer and diffuse into dielectric materials embedding metal interconnect structures or into semiconductor materials in a semiconductor substrate including semiconductor devices and cause reliability issues. In order to avoid such deleterious effects, it is in general desirable to prevent or minimize formation of collateral via structures.

Moreover, in lithographic pattern transfer using etch processes, while it is possible to achieve a higher trench depth, this could only be achieved for wider lines. Using conventional techniques, structures having two depths for one width currently is not possible.

SUMMARY

A system and method of manufacturing semiconductor structures including interconnect areas in which the lithographic etch processes employ two masks, such that interconnect areas exposed by both masks etch deeper (i.e., form a deeper interconnect trench) than single exposed interconnect areas.

According to an aspect of the present disclosure, there is provided a method for generating shapes for a design layout. The method comprises: forming a first lithographic mask having a first feature over a semiconductor wafer structure and using the first lithographic mask to print the feature onto the wafer; exposing the first lithographic mask to form a trench in the wafer; forming a second lithographic mask used in the design layout having a further feature that is overlapped with the first feature used in printing the feature by the first mask, and exposing the second lithographic mask during printing of the further feature; and etching the double exposed area to form the trench in the wafer, wherein the double exposed overlapped feature portion is such that a resultant formed trench is deeper as compared to a depth of a trench formed as a result of etching the printed feature formed as a result of the first exposing using the first mask.

In a further aspect, there is provided a method of forming a metal interconnect structure. The method comprises: forming a dielectric material layer and a stack of hard mask layers over an underlying semiconductor structure, the stack of hard mask layers comprising at least, from bottom to top, a first dielectric layer of a first dielectric material, a lower metallic hard mask layer including a first metallic material, a second dielectric layer including a second dielectric material, an upper metallic hard mask layer including a metallic material, and a third dielectric layer including a third dielectric material;

recessing a first portion of the third dielectric layer and the metallic hard mask layer within an area of a first pattern employing a combination of a first lithographic process and a first etch;

recessing a second portion of the third dielectric layer and the metallic hard mask layer within an area of a second pattern employing a combination of a second lithographic process and a second etch, wherein a cavity is formed within an area of intersection between the first pattern and the second pattern, the cavity having a bottom surface below a first horizontal plane including a bottom surface of the lower metallic hard mask layer.

According to another aspect of the present disclosure, there is provided an apparatus for generating shapes for a design layout. The apparatus comprises a programmed computer including one or more processors in communication with a memory and configured to run an automated program, the automated program configuring the programmed computer to perform: a step of receiving a design layout including a conductive line level, a step of forming a first lithographic mask having a first feature corresponding to the conductive line level over a semiconductor wafer structure and using the first lithographic mask to print the feature onto the wafer; a step of exposing the first lithographic mask to form a trench in the wafer; a step of forming a second lithographic mask used in the design layout having a further feature that is overlapped with the first feature used in printing the feature by the first mask, and a step of exposing the second lithographic mask during printing of the further feature; and a step of etching the double exposed area to form the trench in the wafer, wherein the double exposed overlapped feature portion is such that a resultant formed trench is deeper as compared to a depth of a trench formed as a result of etching the printed feature formed as a result of the first exposing using the first mask.

BRIEF DESCRIPTION OF SEVERAL VIEWS OF THE DRAWINGS

FIGS. 2A-2C show various SEM cross-sectional views of example resulting lithographic features printed using the two different masks of FIG. 2A;

DETAILED DESCRIPTION

Co-pending U.S. patent application Ser. No. 14/285,719 relates to a method of generating a design layout including design shapes that confine stitch-induced via structures above an underlying conductive line level, a system for implementing the same, and a method of forming a metal interconnect structure embodying such a design layout. The present disclosure is directed to structures and software methods that enable multi-depth trench metal interconnect structures.

Aspects of the present disclosure are now described in detail with accompanying figures. It is noted that like and corresponding elements are referred to by like reference numerals. The drawings are not drawn to scale. Ordinals are used merely to distinguish among similar elements, and different ordinals may be employed across the specification and the claims of the instant application.

Figure 1:
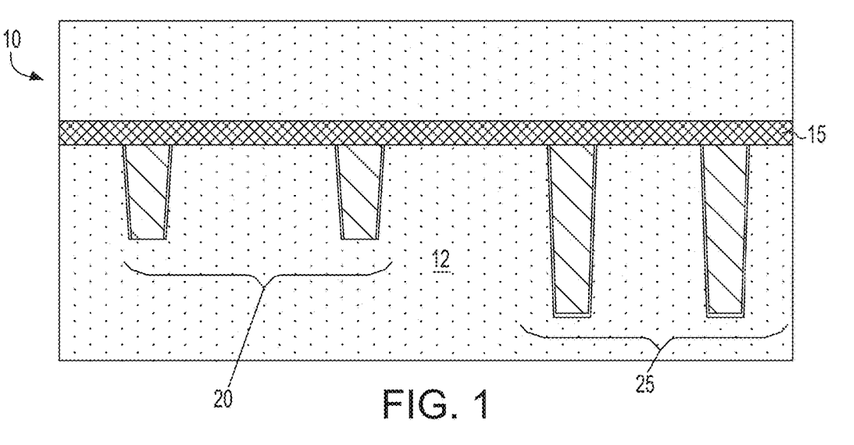
FIG. 1 depicts an exemplary design stack cross-section 10 showing two interconnect structures of two trench depths using multiple masks per layer according to an embodiment of the present disclosure.

Referring to FIG. 1, an exemplary design layout is illustrated, which includes design shapes representing various conductive structures to be formed in a target interconnect structure. As used herein, a "design layout" refers to a collection of data that represents a geometrical relationship between various structural elements of conductive structures embedded in dielectric material layers that can be manufactured on a substrate. As used herein, a "design level" is a level within a design layout that includes geometrical shapes that are related, directly or indirectly, to a same set of processing steps for forming physical objects on a substrate. The geometrical shapes may be represented in a graphics format or in a non-graphics format. As used herein, a "mask level" is identical to a design level except in the former, additional features called dummy features may exist and the shapes may have been modified due to optical proximity correction. As used herein, an "interconnect structure" refers to a structure in which a plurality of conductive structures are embedded in at least one dielectric material layer to provide at least one conductive path. As used herein, a "target interconnect structure" is an ideal interconnect structure in which all structural and compositional parameters comply with a design layout therefor and process assumptions employed in a manufacturing process. As used herein, a "metal interconnect structure" refers to an interconnect structure in which metal structures are embedded as conductive structures. As used herein, a "line level structure" refers to a conductive structure that extends in a horizontal direction within a same level, i.e., between two horizontal planes separated by a thickness of the line level structure, of an interconnect structure. As used herein, a "line level" refers to a level including at least one line level structure. As used herein, a "via level structure" refers to a conductive structure that extends in a vertical direction between two different line levels. As used herein, a "via level" refers to a level between two vertically adjacent line levels. As used herein, an "overlying" level or an "overlying" structure refers to a level or a structure that is located above a level or a structure that is employed as a reference. As used herein, an "underlying" level or an "underlying structure refers to a level or a structure that is located below a level or a structure that is employed as a reference. As used herein, an "immediately overlying" level refers to an overlying level below which no other overlying level exists for a reference level. As used herein, an "immediately underlying" level refers to an underlying level above which no other overlying level exists for a reference level.

FIG. 1 depicts an exemplary design stack cross-section 10 showing two interconnect structures of two trench depths using multiple masks per layer. In particular, as shown in FIG. 1, there is presented a target interconnect structure achieved by the methods described herein in which two trench depths are printed, e.g., in a dielectric layer 12, at a design level. created by exploiting recent technology features, i.e., availability of multiple masks per layer. In the target structure, there is shown a dielectric cap layer 15 having conductive line trenches depending therefrom, including a first formed pair of conductive line trenches 20 terminating at a first depth, and using additional mask, a second formed pair of conductive line trenches 25 terminating at a second depth. As illustrated, the second pair of formed pair of conductive line trenches 25 are at an increased depth relative to the first pair 20.

Such structures depicted in FIG. 1 that provide two trench depths of conductive material at the same width by exploiting stitching technology may be advantageously employed in forming Low-Resistance High-Capacitance capacitors, High-Q inductors, Low-Resistance interconnect. The designs incorporating these two trench depths at increased pitch may be optimized to address electromigration and timing concerns.

In creation of such circuits and structures, first features may be printed on a wafer at a design level using a first mask, and second features are printed at the same design level using a second mask without overlap of the features. The first and second printed features at the same level may be connected using the stitching technique wherein when the second mask is printed, part of the feature of the second printed mask is defined by both the first and second masks—to achieve a stitch, i.e., an overlapping area. For example, printing a "T" shaped pattern may comprise using first mask to print the top horizontal feature of the "T" and then, the base of the T shape may be fabricated (etched) using the second mask which provides the deeper base feature. The intersection at the center top of the "T" shape is the stitch and would be a feature exposed by both masks that provides the deeper etch that a single exposed interconnect area.

Oftentimes multiple masking schemes is used to minimize the stitch area. However, a whole line or a portion may be exposed using multiple masks, and may be used to form a deeper interconnect trench.

Figure 2A:
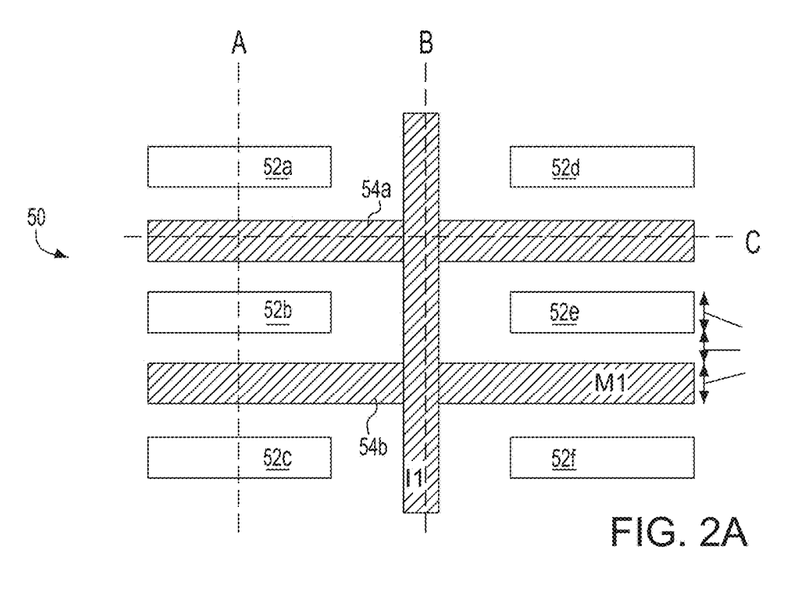
FIG. 2A shows an exemplary use of two masks for forming a conductive interconnect.
Figure 2B:
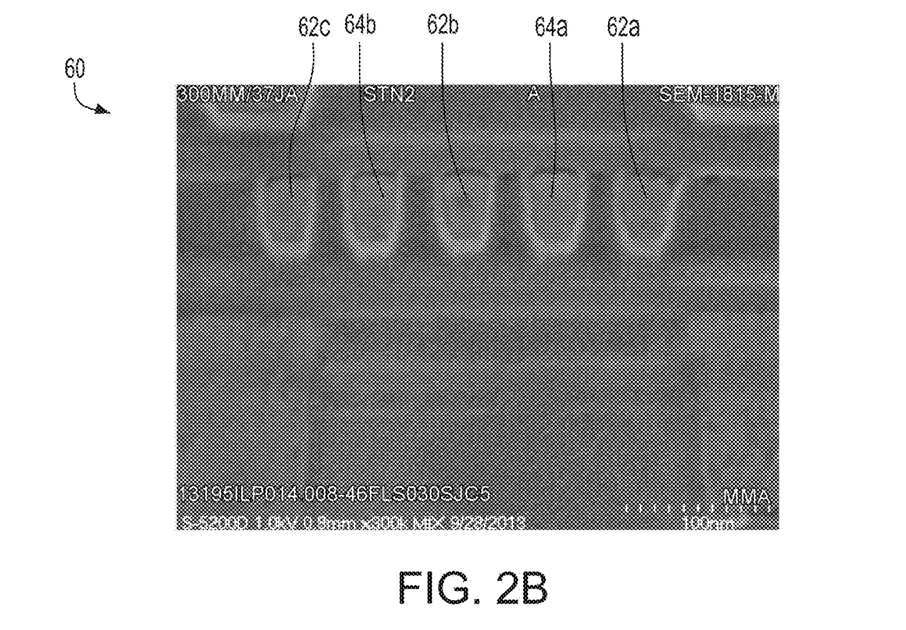

FIG. 2A shows an example of using two lithographic masks used to print a pattern of the features shown as depicted in the SEM image of FIG. 2B. In FIG. 2A, a first mask comprising linear features 52a, . . . , 52g is formed and used in subsequent etch and deposition processes to form corresponding first mask pattern features in a semiconductor wafer substrate. Then, a second mask comprising linear features 54a and 54b is formed and overlayed onto the substrate area upon which the printed first mask pattern features have been formed. The second mask is used in subsequent etch and deposition processes to form corresponding second mask pattern features in the semiconductor wafer substrate.

FIG. 2B depicts an example SEM micrograph of a portion 60 of the resultant patterned conductive structures built by a process employing the two masks. The SEM micrograph portion is shown taken along cross-sectional line A-A of FIG. 2A. In the cross-sectional view taken along line A-A of FIG. 2A, there is formed five trenches, three of which 62a, 62b, 62c are formed using as a result of applying a first mask (having exemplary design layout of corresponding features 52a, 52b, 52c) and two formed trenches 64a, 64b are formed using as a result of applying a second mask (having exemplary design layout of corresponding features 54a, 54b). Thus, in this application of two masks, two interconnect structures of equal trench depths are formed.

Figure 2C:
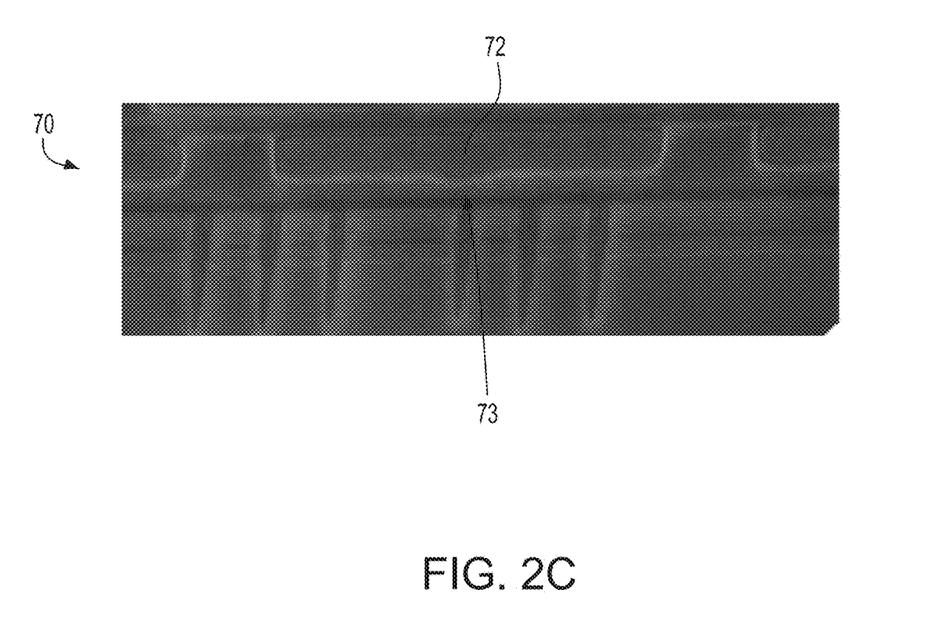

FIG. 2C depicts an example SEM micrograph of a portion 70 of the resultant patterned conductive structures built by the process employing the two masks shown taken along cross-sectional line C-C of FIG. 2A. In the cross-sectional view taken along line C-C of FIG. 2A, there is shown the formed trench 72 of conductive material resulting from application (etching+deposition) using the exemplary second mask and its mask feature 54a. As shown, at a location corresponding to the intersection of the feature formed as a result of applying first mask feature 52g (along line B-B) and applying the second mask feature 54a (along line C-C) there results a bump or depression 73 which is deeper than the depth of the remaining length of the trench 72. Thus, in this application of two masks, structures of unequal height are created using the overlapped exposure.

Figure 3:
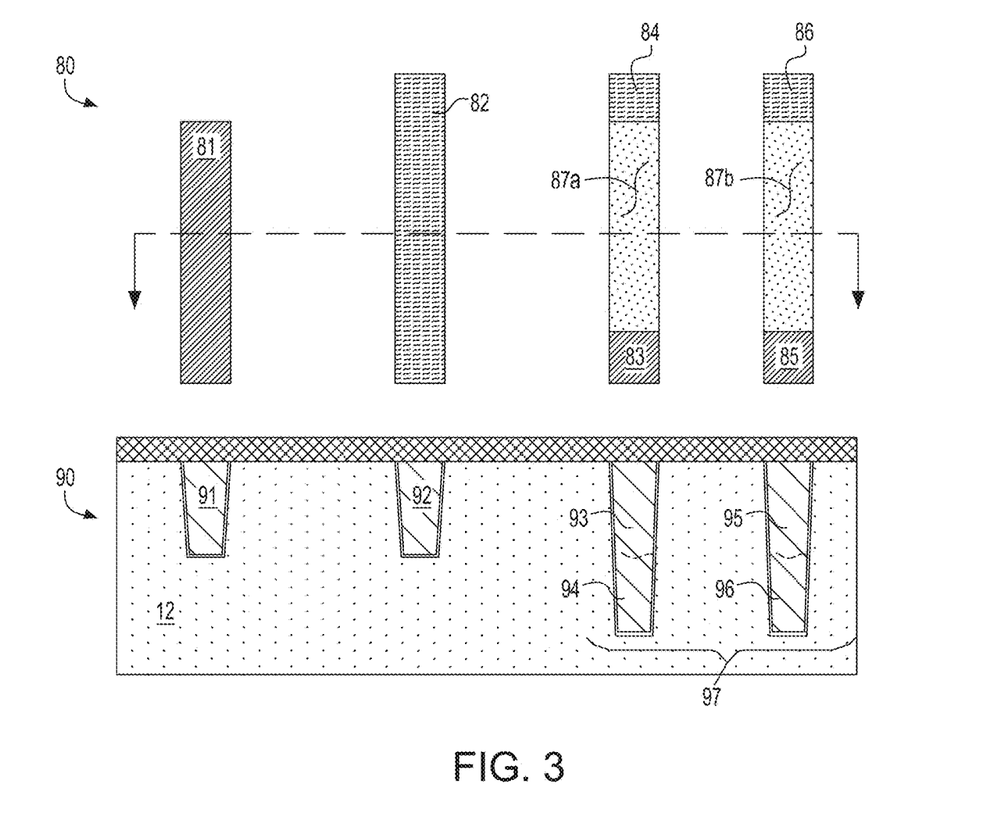
FIG. 3 is a top down layout view of two masks in an example wafer printing process, and cross-sectional views of the corresponding features printed on a wafer using two masks, with two rightmost portions of the two masks overlapped to result in a deeper trenches of the same width as other printed features printed without mask feature overlap.

FIG. 3 shows a top-down aerial view 80 of the application and use of two masks—a first mask having first layout features 81, 83 and 85, and a second mask having second layout features 82, 84 and 86—in order to form an interconnect conductive structures that would have two trench depths as shown in the corresponding cross-sectional view of trenches 90. First mask features 81, 83 and 85 are line features of equal width and length, while second mask feature 82, 84 and 86 are substantially equal in width as first mask features. However, when the second mask is overlayed, the line feature 82 of the second mask is situated between the two mask features 81 and 83 of the first mask. Moreover, when the second mask is overlayed, the line features 84 and 86 are situated to exactly overlay the respective two mask features 83 and 85 of the first mask as shown in the respective overlapped feature portions 87a, 87b. In the etch process, as a result of exposing and etching the first mask features, for example, there are formed resultant trenches 90 including trenches 91, 93 and 95 that are printed at the same height, i.e., each having identical first trench depths. However, as a result of exposing and etching second mask features in the same location as the first mask, and using substantially the same exposure time and dose, there is formed a resultant trench 92 that corresponds to the second line feature 82 at the same print height, and resultant trenches 94 and 96 that extend the corresponding first trenches 93 and 95 formed by applying the first mask features 83, 85 deeper into the layer 12 as a result of the double exposure of overlayed feature portions 87a, 87b. That is, two trenches 97 are formed deeper than trenches 91 and 92 and thus the resultant interconnect structure has two different heights and substantially equal widths. It is understood that this configuration is merely exemplary, and non-limiting, and that deep versus standard trench depth can be used in any combination.

One embodiment of a lithographic semiconductor manufacturing process for creating the conductive interconnect structure having two depth features resulting from single and double exposing is now described. The stack layer thicknesses, exposure and etch processes applied are such to control the printing a trench using single and double exposures at a depth that avoids encroaching an underlying metal interconnect yet still providing features having two interconnects of two different interconnect heights.

In the one embodiment, a POR (process of record) BEOL stack (e.g., where a metal such as copper fills trenches in an oxide) is formed as described in co-pending U.S. patent application Ser. No. 14/285,719 incorporated by reference herein. In that process, stack layer thicknesses and etch process are optimized to differentiate between heights (depths) of interconnect single vs. double exposed areas. These parameters may be tuned to enable the invention with the stack changes as discussed herein with respect to FIGS. 4 and 5.

In a further embodiment, a stack change is proposed that modifies either embodiment of the BEOL stack as formed according to techniques described in the co-pending U.S. patent application Ser. No. 14/285,719. In each stack for forming metal interconnect structures as described co-pending U.S. patent application Ser. No. 14/285,719, intentional via structures are formed to intentionally short the via to a formed lower layer interconnect structure. The techniques of the prior application, the process makes easier the shorting to the lower layer, that is, the double exposures are used to intentionally short to a bottom layer. In the present embodiment, only a different height is being achieved with no shorting to an underlying metal interconnect layer.

Figure 4:
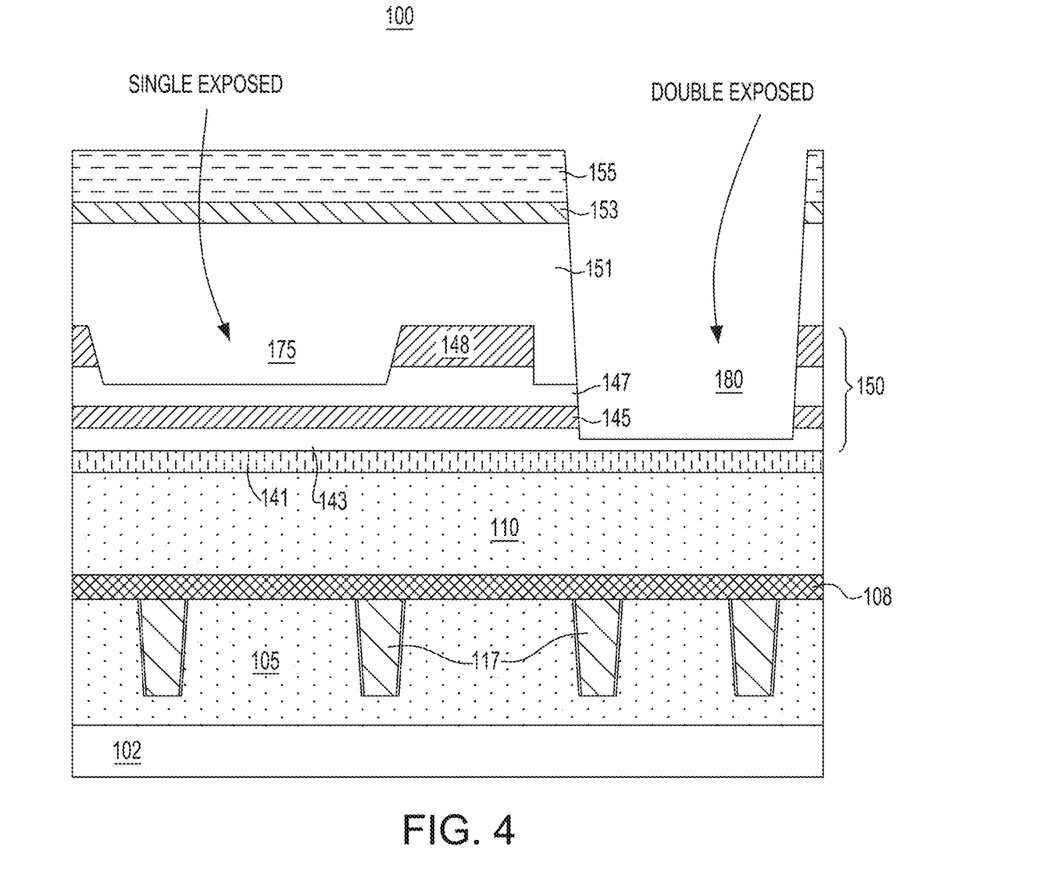
FIG. 4 is a vertical cross-sectional view of a first POR stack layout modification in which an added metal hardmask layer (e.g., TiN) is formed to provide a hard etch stop for a formed trench resulting from use of a second line level lithographic mask subject to double exposure for transferring of the second line pattern into the upper metallic hard mask layers according to an embodiment of the present disclosure.

FIG. 4 shows a cross-sectional view of a portion of a BEOL Stack 100 similar to the POR (process of record) stack described in herein incorporated, co-pending U.S. patent application Ser. No. 14/285,719. Here, the height is process controlled to enable printing of two different heights and same widths. In FIG. 4, semiconductor manufacturing processes include single exposure and double exposure steps using a POR (process of record) stack the structure 100 as follows:

Referring to FIG. 4, a first exemplary metal interconnect structure formed according to processes implementing a first stack modification embodiment of the present disclosure is shown. The first exemplary metal interconnect structure can be a target interconnect structure for the design layout, e.g., such as shown in FIG. 3. Here in the first stack POR 100 shown in FIG. 4, processes are more controlled so that two different trench heights result and the stack layers thicknesses and etch processes are optimized such that resulting single exposed trench depth and the double exposed trench depths are significantly different.

The first exemplary interconnect structure includes a stack 100, from bottom to top, of an optionally provided substrate 102, a dielectric material layer 105 (or a dielectric stack including a second dielectric material layer), an optional dielectric cap layer 108, a further dielectric material layer 110 overlying the cap layer, and a stack 150 of hard mask layers.

The substrate 102 can include a semiconductor substrate and at least one semiconductor device thereupon or therein. The substrate 102 may additionally include interconnect structures (not shown). The dielectric material layer 105 and the further dielectric material layer 110 can include a dielectric material such as silicon oxide, silicon nitride, silicon oxynitride, and/or porous or non-porous organosilicate glass (OSG). Each of the dielectric material layers 105, 110 can have a thickness in a range from 50 nm to 300 nm, although lesser and greater thicknesses can also be employed.

The optional dielectric cap layer 108, if present, can include a dielectric material that prevents diffusion of metallic impurities therethrough. The optional dielectric cap layer 108 may include a dielectric material such as nitrogen-doped organosilicate glass and/or silicon nitride. The thickness of the optional dielectric cap layer 108, if present, can be from 10 nm to 40 nm, although lesser and greater thicknesses can also be employed. Each of the dielectric material layers 105, 110 may include a dielectric material layer that includes a dielectric material that prevents diffusion of metallic impurities therethrough. For example, a bottom portion of the dielectric material layer 105 and/or a bottom portion of the dielectric material layer 110 may include a dielectric material that such as nitrogen-doped organosilicate glass and/or silicon nitride.

The dielectric material layer 105 may include a hard mask layer (not shown) including a dielectric material that is different from the dielectric material of the underlying portion of the dielectric material layer 105. In this case, the hard mask layer can include, for example, silicon oxide or a non-porous organosilicate glass. The thickness of a hard mask layer can be, for example, from 3 nm to 10 nm, although lesser and greater thicknesses can also be employed. In one embodiment, the first dielectric material layer 105 may include a stack, from bottom to top, of a porous dielectric material layer and a non-porous dielectric material layer.

In one embodiment, the dielectric material layer 105 can include an Mx line level dielectric material layer, and the dielectric material layer 110 can include an M(x+1) line level dielectric material layer. Mx line level conductive line structures (117) may be embedded in the dielectric material layer 105. The Mx line level conductive line structures (117) are herein referred to as underlying conductive line level structures. The dielectric material layer 105 may, or may not, be an interconnect-level dielectric material layer, and may, or may not, include line level conductive structures (not shown).

The Mx line level conductive line structures (117) the underlying conductive line level structures are embedded in the second dielectric material layer 105. The top surfaces of the Mx line level conductive line structures (117) can be coplanar with the top surface of the dielectric material layer 105.

The Mx line level conductive line structures (117) can include an interconnect conductive line structure that provide electrical connections among electrical components as known in the art, and a via-catching conductive line structure. The via-catching conductive line structure corresponds to a via-catching design shape in the underlying conductive line level (i.e., the Mx line level) in the exemplary design layout. The interconnect conductive line structure 117 can include a metallic liner (not shown) and a metallic portion. The via-catching conductive line structure can include another metallic liner and another metallic portion.

The stack of hard mask layers 150 can include at least one dielectric layer and at least one metallic hard mask layer. In one embodiment, the stack of hard mask layers 150 can include a first dielectric layer 141 including a first dielectric material, a lower metallic hard mask layer 143 including a first metallic material, a second dielectric layer 145 including a second dielectric material, an upper metallic hard mask layer 147 including a metallic material, and a third dielectric layer 148 including a third dielectric material. In one embodiment, the first dielectric material layer 141 can include OMCTS or octamethylcyclotetrasiloxane hard mask, while second and third dielectric material layers 145 and 148 may include such as Tetraethyl orthosilicate (TEOS) or like non-porous organosilicate glass. It is understood that the dielectric material layers 145, 148 of stack 150 can include silicon oxide. In one embodiment, each of the lower and upper metallic hard mask layers (143, 147) can include a metallic nitride and/or a metallic carbide such as TiN, TaN, and WN and/or TiC, TaC, and WC. The thickness of the first dielectric layer 141 can be from 3 nm to 10 nm, the thickness of the lower metallic hard mask layer 143 can be from 8 nm to 30 nm, the thickness of the second dielectric layer 145 can be from 8 nm to 30 nm, the thickness of the upper metallic hard mask layer 147 can be from 15 nm to 60 nm, and the thickness of the third dielectric layer 148 can be from 20 nm to 80 nm, although lesser and greater thicknesses can also be employed for each layer.

A silicon-based polymer layer 151 may be formed over the stack of hard mask layers 150. The silicon-based polymer layer 151 can include a SiO-rich siloxane polymer such as HM8006™ by Honeywell©. The thickness of the silicon-based polymer layer 151 can be from 100 nm to 400 nm, although lesser and greater thicknesses can also be employed. A first silicon-based antireflective coating (ARC) layer 153 can be applied over the silicon-based polymer layer 151.

A first photoresist layer 155 can be formed over the first silicon-based ARC layer 153 and lithographically patterned with a first line pattern that results in the formation of the interconnect trench 175 of a first trench depth of a design layout after single exposure. That is, the printing of a first trench pattern in the first photoresist layer 155 can be performed by employing a first line level lithographic mask, which is a first lithographic mask for an M(x+1) line level (which is a conductive line level).

Although not shown, it is understood that a first line pattern in the first photoresist layer 155 via a single exposure may be transferred through the first silicon-based ARC layer 153 and the silicon-based polymer layer 151 and into an upper portion of the stack of hard mask layers 150 by an anisotropic etch such as a reactive ion etch. In one embodiment, the first line pattern can be transferred through the third dielectric layer 148 and into an upper region of the upper metallic hard mask layer 147 including a metallic material. The first photoresist layer 155, the first silicon-based ARC layer 153, and the silicon-based polymer layer 151 can be subsequently removed, for example, by ashing. The recessed surfaces of the stack of hard mask layers 150 can be recessed relative to the top surface of the upper metallic hard mask layer 147 by a first recess depth. The depth of the bottom surfaces of the recessed regions, as measured from the topmost surface of the upper metallic hard mask layer 147, is the first recess depth. In one embodiment, the first recess depth can be greater than zero and is less than the thickness of the upper metallic hard mask layer 147. The bottom surface of the recessed region can be a recessed surface of the upper metallic hard mask layer 147 that is formed between the topmost surface of the upper metallic hard mask layer 147 and the bottom surface of the upper metallic hard mask layer 147.

As shown in FIG. 4, for the forming of the second trench 180 in a double exposed area, the exemplary lower metallic (e.g., TiN) hard mask layer 143 provides a barrier to control the etch such that the trench formed by the double exposed mask feature will be controlled.

Figure 5:
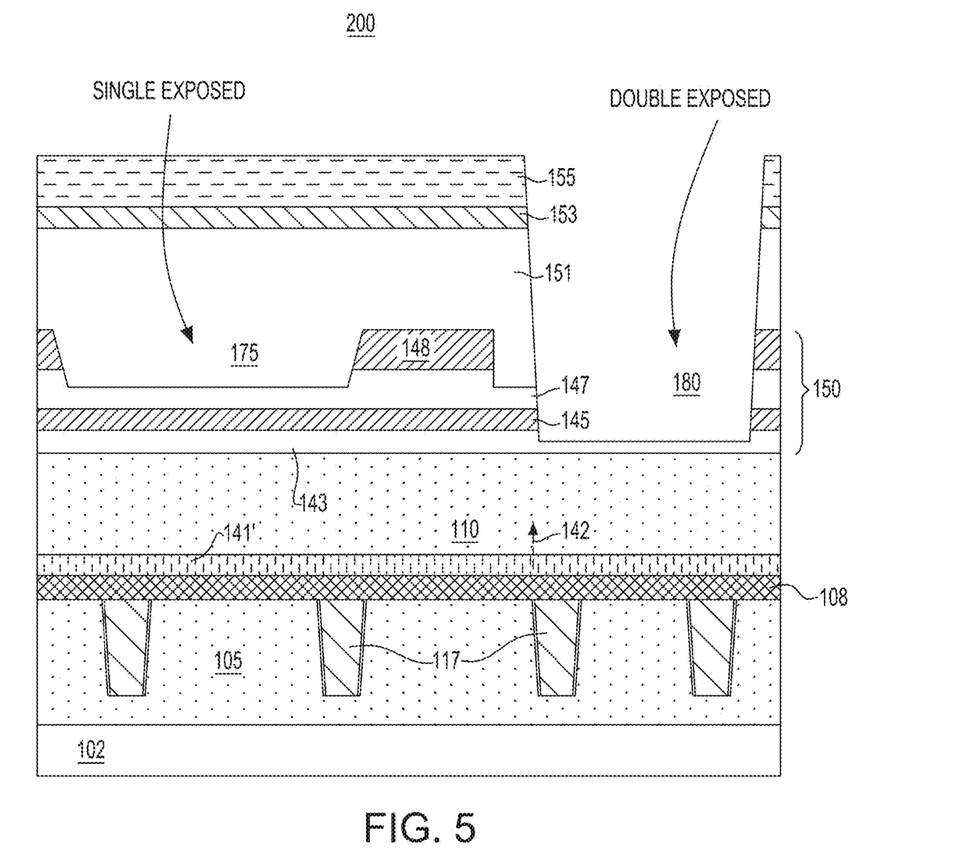
FIG. 5 is a vertical cross-sectional view of a second POR stack layout modification in which an added metal hardmask layer (e.g., OMCTS-HM) is formed at the bottom of the OMCTS stack to catch the double exposed areas, and which can be shifted upwards as needed to control bottom of the etch in accordance with a second embodiment.

In a further embodiment, as shown in FIG. 5, the first POR BEOL stack 200 is modified such that the first dielectric layer (e.g., OMCTS-HM) 141 is shifted downward toward the bottom of the OMCTS stack. For example, in the embodiment depicted, the dielectric layer 141' (e.g., OMCTS-HM layer) is first formed as a layer atop the dielectric cap layer 108 such that the second exposure cannot penetrate beyond the bottom OMCTS dielectric layer 141'.

Moreover, it is understood that, the location of the bottom of the formed double exposed trench area may be governed by the location of the bottom OMCTS-HM hardmask layer 141' and its location may be adjusted anywhere within dielectric region 110 as indicated by the arrow 142 as a catch pattern for the double exposed trench such that the bottom edge of the formed trench will not penetrate beyond the level of the bottom hardmask layer 141'.

Advantageously, in the method described herein, interconnect trenches are targeted instead for use in isolation. Further, the methods utilize the already available double patterning process and the two masks. Thus the present methods enable multiple trench depths per a given dual damascane layer with equal trench width.

Figure 6:
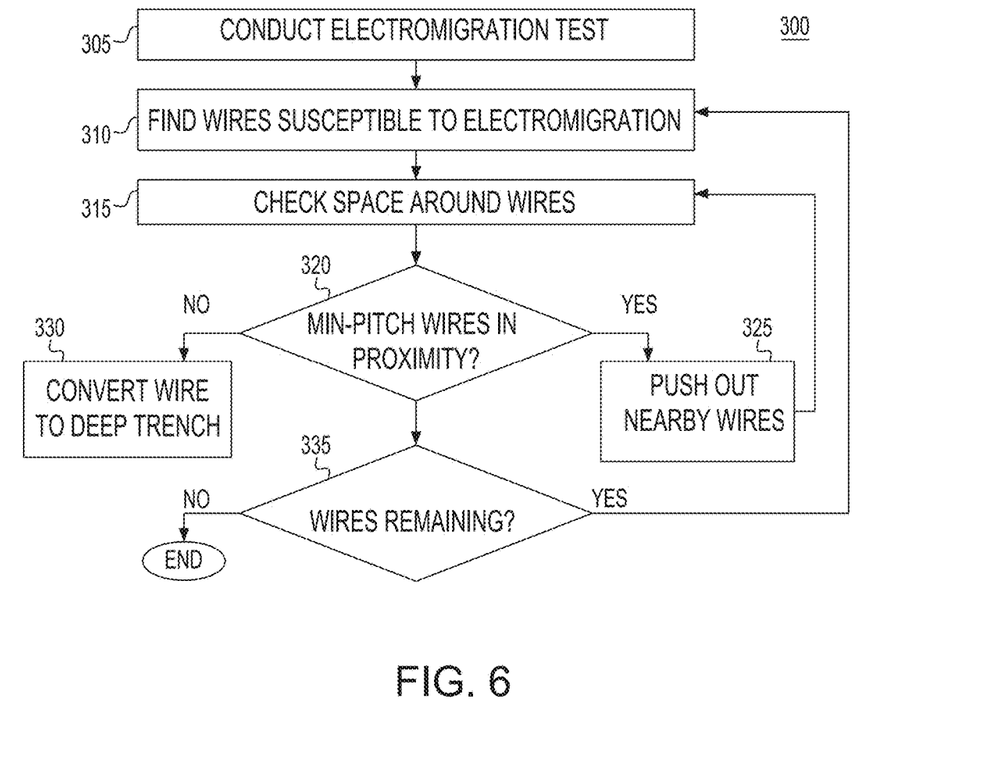
FIG. 6 shows considerations of a design flow for building the interconnects as described herein accounting for electromigration considerations that takes into account layout and topology information.

FIG. 6 shows considerations of a design flow 300 for building the interconnect structures as described herein accounting for electromigration considerations. Here, the method 300 performs electromigration tests, e.g., models and simulations that takes into account layout and topology information available for proposed conductive interconnects structures described herein. In a design flow, knowing the dimensions and process details, the method determines which interconnects of the proposed design layout are to be prompted as raising electromigration concerns. Thus, at a first step 305, given the proposed interconnect structure layout design information and parameters, there is conducted, such as by simulation, an electromigration test.

A result of such test(s), any wires or conductive structures of a particular design layer that are found would be susceptible to electromigration are flagged at 310. As a result of flagging particular wires of interconnect structures, at 315, the space around each of those wires are checked to determine if the structures can be modified, e.g., re-routed, and the design updated. For example, to fix electromigration may be to increase the width of the conductor wire. Thus, a determination is made at step 320 as to whether there remains a minimum pitch wires in proximity of the wires determined as susceptible to electromigration. If wires are found nearby in proximity that encroaches the minimum pitch, the design considers moving or pushing out the nearby wires at 325 and returning to step 315 to determine whether that increases the space around the flagged wires. If space permits, this process may be iterated until the nearby wires are sufficiently moved away from the subject wire so that the electromigration concern is avoided.

Otherwise, at 320, if it is determined that there are no minimum-pitch wires in the proximity of the subject proposed wire, then the method at 330 converts that wire to a deeper trench version such as created by use of the double exposure techniques involving the modified POR stack structures. After converting the wire to a deeper trench version, the process proceeds to step 335 where a determination is made as to whether there are any other wires that are found susceptible to electromigration as determined at step 310. If there are no more wires to consider, the method ends; otherwise, the method returns to step 310 to determine whether with the design of the converted deeper trench wire raises any further electromigration concerns of other nearby wires.

That is, given the deeper trench version of the converted wire, the deeper line becomes deeper which lowers the resistance and thereby improving the electromigration performance due to increased cross-sectional area of that deeper wire. Thus, it is conceivable given the processes described herein that control of the width of the double exposed trench, it is conceivable that no nearby wires need to be pushed out.

Figure 7:
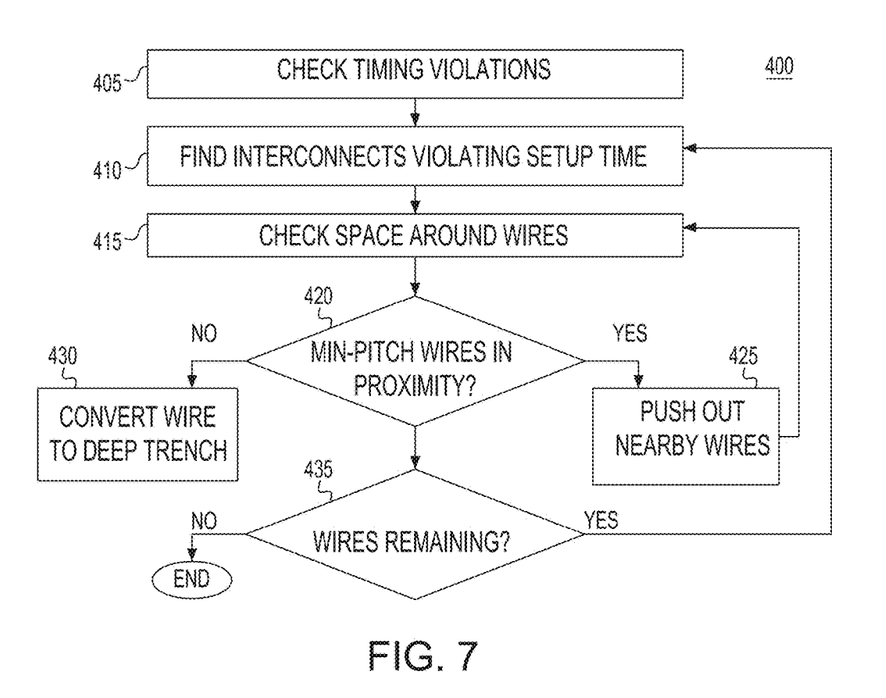
FIG. 7 shows considerations of a design flow 400 for building the interconnects as described herein accounting for signal flow timing considerations.

FIG. 7 shows considerations of a design flow 400 for building the interconnect structures as described herein accounting for signal flow timing considerations. Here, the method 400 performs timing tests, e.g., models and simulations, that takes into account layout and topology information available for proposed conductive interconnects structures described herein. In a design flow, knowing the dimensions and process details, the method determines which interconnects of the proposed design layout are to be prompted as raising timing violations. Thus, at a first step 405, given the proposed interconnect structure layout design information and parameters, there is conducted test, such as by simulation, to ascertain digital timing circuit performance including detecting setup timing violation, hold time variations, and other timing considerations, etc. A result of such test(s), any wires or conductive structures of a particular design layer that are found may violate a setup or hold time are flagged at 410.

As a result of flagging particular wires of interconnect structures, at 415, the space around each of those wires are checked to determine if the structures can be modified, e.g., re-routed, and the design updated. For example, to modify setup and hold times may be to increase the width of the conductor wire. Thus, a determination is made at step 420 as to whether there remains a minimum pitch wires in proximity of the wires determined as susceptible to violating a setup time, for example. If wires are found nearby in proximity that encroaches the minimum pitch, the design considers moving or pushing out the nearby wires at 425 and returning to step 415 to determine whether that increases the space around the flagged wires. If space permits, this process may be iterated until the nearby wires are sufficiently moved away from the subject wire so that the detected timing violation is avoided.

Otherwise, at 420, if it is determined that there are no minimum-pitch wires in the proximity of the subject proposed wire, then the method at 430 converts that wire to a deeper trench version such as created by use of the double exposure techniques involving the modified POR stack structures described herein. After converting the wire to a deeper trench version, the process proceeds to step 435 where a determination is made as to whether there are any other wires that are found susceptible to violating a setup time at step 410. If there are no more wires to consider, the method ends; otherwise, the method returns to step 410 to determine whether with the design of the converted deeper trench wire raises any further timing violation concerns of other nearby wires.

The various processing steps can be implemented by an apparatus including one or more processors in communication with a memory, i.e., a memory device. The one or more processors can be configured to run an automated program that includes instructions for implementing one, a plurality, or all of the steps described. One or more or all of the steps described below can be performed employing an apparatus including one or more processors in communication with a memory and configured to perform the corresponding step(s).

If an automated program that runs on an apparatus employing one or more processors is employed, the automated program can be configured to receive a design layout such as the exemplary design layout of FIG. 1.

While the present disclosure is described employing two colors, variations of the present disclosure employing three or more colors for the conductive line level are expressly contemplated herein.

Each of the at least one underlying conductive line level includes underlying-conductive-line-level design shapes that represent underlying conductive line structures in an underlying conductive line level located underneath the conductive line level in the target interconnect structure. The underlying-conductive-line-level design shapes may have the same color (i.e., does not use mask decomposition techniques), or may include a plurality of decomposed design shapes having different colors that correspond to different lithographic masks (i.e., use mask decomposition techniques). The underlying-conductive-line-level design shapes can include electrically-active Mx line level design shape, and may optionally include one or more via-catching design shapes. The via design level includes via-level design shapes that represent via structures to vertically interconnect the conductive line structures and the underlying conductive line structures. The initial design layout may include line-overlap-derived stitches (See FIG. 1).

Figure 8:
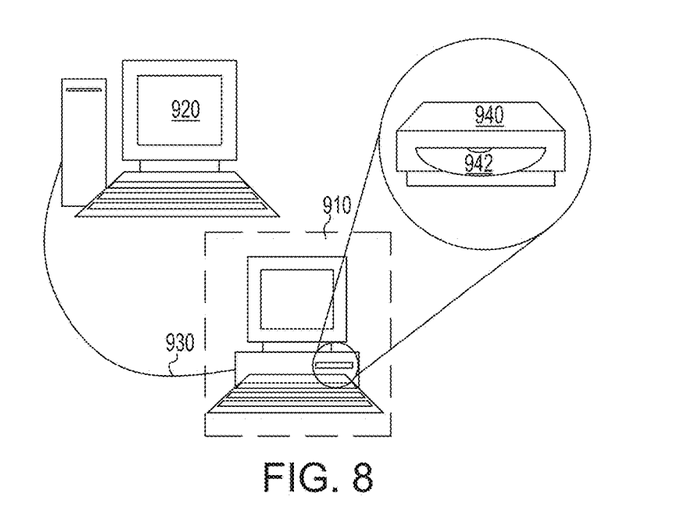
FIG. 8 illustrates an exemplary apparatus that can be employed to implement the methods of various embodiments of the present disclosure.

Referring to FIG. 8, an exemplary apparatus is illustrated, which can be employed to implement the methods of various embodiments of the present disclosure. The apparatus can be configured to perform at least one and/or any of the steps in the flow charts of FIGS. 6 and 7 in one or more automated steps by running an automated program on any computing means known in the art. The apparatus can be employed to decompose design shapes in a design level into a plurality of target design levels. The apparatus includes one or more processors in communication with a memory and is configured to run an automated program.

The automated program can include any or all of the steps of the first and/or second flow charts. In one embodiment, the apparatus can include at least one computing means 910 including one or more processor units that are in communication with a memory. The at least one computing means 910 can include a computer as known in the art. The at least one computing means 910 can be in communication with a database 920, which can be a standalone computing means or can be incorporated into the at least one computing means 910. The database can store all or a subset of the design shapes for the design levels provided at step 610 or generated at later processing steps. If the database 920 is a standalone computing means, a data cable 930 or wireless communication can be employed to transfer data between the database 920 and the at least one computing means 910. The database can store information on process assumptions, and any or all of predefined parameters to be employed while the automated program runs.

The at least one computing means 910 can be employed to perform at least one or all of the steps described above with, or without, human intervention depending on the program that runs thereupon. The input data and the output data (e.g., the design for a pupil filter according to various embodiments of the present disclosure) can be stored in at least one non-transitory machine-readable data storage medium that can be provided within the at least one computing means 910 and/or within at least one non-transitory machine-readable data storage medium provided within the database 920. The non-transitory machine-readable data storage medium may be of any type known in the art.

One or more non-transitory machine readable medium within the at least one computing means 910 and/or the database 920 can be a portable non-transitory machine-readable data storage medium 942 such as a CD ROM or a DVD ROM. A data-writing device 940 may be provided in the at least one computing means 910 or within the database 920 to enable encoding of the data representing any of the data employed during the various steps in the first and/or second flow chart(s).

The design data can include the various design shapes for the design level as originally provided, and for each and/or all of the various mask level design layouts of the present disclosure. The design data for the mask level design layouts of the present disclosure can be transferred to a manufacturing facility that can manufacture a set of lithographic masks corresponding to the design shapes for the mask level design layouts. The data transfer to the mask writing device can be effected by a portable non-transitory machine-readable data storage medium 942, a data cable (not shown) or by wireless communication.

In one embodiment, the various data employed in the method of the present disclosure, including the design layout, the annotated design layout, any intermediate structure files, and the final structure file, can be in any data format used for the exchange of layout data of integrated circuits and/or symbolic data format (e.g. information stored in a GDSII (GDS2), GL1, OASIS, map files, or any other suitable format for storing such design data structures). The various data may comprise information such as, for example, symbolic data, map files, test data files, design content files, layout parameters, and any other data required by a reticle manufacturer to manufacture a set of at least one reticle encoding the third modified chip design layout.

A machine-readable medium embodying the design data for the mask level design layouts of the present disclosure can have the functionality of generating a representation, in a format perceptible by humans or recognizable by an automated machine (such as an optical character reader or a program configured to recognize graphics data), of a semiconductor structure, a semiconductor device, a semiconductor circuit, or any other physical implementation of the devices and structures of the present disclosure. The design data for the mask level design layouts of the present disclosure, as embodied in the machine-readable medium, can be organized such that the inherent physical or logical relationship among data elements can be represented in a temporary or permanent display device such as a computer monitor or at least one printed sheet of paper. Further, the design data for the mask level design layouts of the present disclosure can be designed to support specific data manipulation functions, including, but not limited to, editing, adding, subtracting, or otherwise modifying or modulating the various data elements within the design data for the mask level design layouts. In addition, the design data for the mask level design layouts of the present disclosure can be configured to cause the representation in the format perceptible by humans or recognizable by an automated machine to include various display elements (e.g., line, curves, symbols, areas, volumes, etc.) that correspond to each of the various data elements within the design data for the mask level design layouts. The design data for the mask level design layouts of the present disclosure can be a functional descriptive material as recorded on the machine-readable medium, and as such, can become structurally and functionally interrelated to the machine-readable medium so as to change the format and organization of the various memory elements within the machine-readable medium and confer a functionality of generating at least one visual representation when read by a display program, which can be a visual display program or a printing program, and can reside in a computing device, or can be encoded within the same machine-readable medium, or can be encoded within a different machine-readable medium that can be read by the same computing device that reads the machine-readable medium encoding the design data for the mask level design layouts of the present disclosure.

In one embodiment, a machine-readable medium embodying the design data for the mask level design layouts of the present disclosure can additionally encode a computer program that enables the generation of a representation, in a format perceptible by humans or recognizable by an automated machine. In one embodiment, the computer program that enables the generation of a representation, in a format perceptible by humans or recognizable by an automated machine can reside in a computing device or in another machine-readable medium that can be read by a computing device configured to read the machine-readable medium embodying the design data for the mask level design layouts of the present disclosure.

Upon running of the computer program on the design data for the mask level design layouts of the present disclosure, a representation of the design data for the t mask level design layouts can be generated in a format perceptible by humans or recognizable by an automated machine, which can be employed to design, manufacture, and/or to test any of a semiconductor structure, a semiconductor device, a semiconductor circuit, or any other physical implementation of the devices, structures and/or circuits of the present disclosure as embodied in the design data for the mask level design layouts. Alternately or additionally, a representation of the design data for the mask level design layouts as generated in a format perceptible by humans or recognizable by an automated machine can be employed to design, manufacture, and/or to test any design for a semiconductor structure, a semiconductor device, a semiconductor circuit, or any other physical implementation of the devices and structures of the present disclosure as embodied in the design data for the mask level design layouts.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A method of forming a metal interconnect structure, said method comprising:

controlling, using a hardware processor, a material deposition tool to form a dielectric material layer and a stack of hard mask layers over an underlying semiconductor structure, said stack of hard mask layers comprising at least, from bottom to top, a first dielectric layer of a first dielectric material, a lower metallic hard mask layer including a first metallic material, a second dielectric layer including a second dielectric material, an upper metallic hard mask layer including a metallic material, and a third dielectric layer including a third dielectric material;

controlling, using the hardware processor, a semiconductor lithographic patterning tool to form a first pattern of materials on top said third dielectric layer, and controlling an etching tool to recess a first portion of said third dielectric layer and said metallic hard mask layer within an area of the first pattern by employing a combination of a first lithographic process and a first etch; and controlling, using the hardware processor, the semiconductor lithographic patterning tool to form a second pattern of materials on top said third dielectric layer, and controlling the etching tool to recess a second portion of said third dielectric layer and said metallic hard mask layer within an area of the second pattern by employing a combination of a second lithographic process and a second etch, wherein a cavity is formed within an area of intersection between said first pattern and said second pattern, said cavity having a bottom surface below a first horizontal plane including a bottom surface of said lower metallic hard mask layer, wherein said first lithographic process and second lithographic process result in a double exposed overlapped feature portion at said area of intersection such that a resultant formed trench is deeper as compared to a depth of a trench formed as a result of the first lithographic process and the first etch.

2. The method of claim 1, wherein said first dielectric layer of a first dielectric material is embedded within said dielectric material layer beneath and separated from said lower metallic hard mask layer and define an etch stop layer when etching said double exposed feature.

3. The method of claim 1, wherein said first dielectric layer of a first dielectric material is formed underneath said dielectric material layer and separated from said lower metallic hard mask layer and define an etch stop layer when etching said double exposed feature.

4. The method of claim 1, wherein a resultant printed feature at said overlapped feature portion is of a same width as compared to a width of a first feature formed as a result of the first lithographic process and a first etch.

5. The method of claim 1, further comprising:
checking, using the hardware processor, whether a design layout includes forming a subject conductive structure that violates an electromigration phenomena, and one or more of:
  modifying placement of nearby conductive structures in proximity to the subject structure found to violate an electromigration consideration; and
  converting said subject structure into said deeper conductive trench by performing a double exposure at the overlapped feature portion using said first lithographic process and said first etch and said second lithographic process and said second etch.

6. The method of claim 1, further comprising:
checking using the hardware processor, whether a design layout includes forming a subject conductive structure that violates a setup or hold timing consideration, and one or more of:
  modifying placement of nearby conductive structures in proximity to the subject structure found to violate said setup or hold timing consideration; and
  converting said subject structure into said deeper conductive trench by performing a double exposure at the overlapped feature portion using said first lithographic process and said first etch and said second lithographic process and said second etch.

* * * * *